United States Patent
Wang et al.

(10) Patent No.: US 10,181,358 B2
(45) Date of Patent: Jan. 15, 2019

(54) SENSE AMPLIFIER

(71) Applicant: MEDIATEK Inc., Hsin-Chu (TW)

(72) Inventors: Chia-Wei Wang, Fengyuan (TW);
Shu-Lin Lai, Taichung (TW); Yi-Te Chiu, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/492,014

(22) Filed: Apr. 20, 2017

(65) Prior Publication Data

US 2018/0114583 A1    Apr. 26, 2018

Related U.S. Application Data

(60) Provisional application No. 62/412,881, filed on Oct. 26, 2016.

(51) Int. Cl.
*G11C 17/00*    (2006.01)
*G11C 17/18*    (2006.01)
*G11C 7/06*     (2006.01)

(52) U.S. Cl.
CPC ............... *G11C 17/18* (2013.01); *G11C 7/06* (2013.01); *G11C 7/067* (2013.01)

(58) Field of Classification Search
CPC ............ G11C 17/18; G11C 7/06; G11C 7/067
USPC .................................. 365/94, 189.11, 210.11
See application file for complete search history.

(56) References Cited

U.S. PATENT DOCUMENTS

| | | | | |
|---|---|---|---|---|
| 5,568,438 A * | 10/1996 | Penchuk | ................ | G11C 7/062 327/52 |
| 5,889,702 A * | 3/1999 | Gaultier | ............. | G01R 31/3004 365/185.2 |
| 6,445,367 B1 * | 9/2002 | Suzuki | ..................... | G09G 3/22 345/75.2 |
| 6,759,877 B1 * | 7/2004 | Desai | ............... | H03K 19/00384 326/119 |
| 6,844,750 B2 * | 1/2005 | Hsu | ..................... | G01R 31/3012 324/762.09 |
| 6,982,591 B2 * | 1/2006 | Abadeer | ................. | G05F 3/242 327/541 |
| 7,002,375 B2 * | 2/2006 | Hsu | ..................... | H03K 19/0963 326/34 |
| 7,162,652 B2 * | 1/2007 | Issa | ....................... | G06F 1/3203 713/300 |
| 7,256,621 B2 * | 8/2007 | Lih | .................... | H03K 19/0013 326/121 |
| 7,332,937 B2 * | 2/2008 | Hsu | .................... | G01R 31/3008 326/31 |
| 7,417,469 B2 * | 8/2008 | Cheng | ................ | G01R 31/3008 326/112 |

(Continued)

OTHER PUBLICATIONS

TIPO Office Action dated May 22, 2018 in Taiwan application (No. 106136963).

*Primary Examiner* — Viet Q Nguyen

(74) *Attorney, Agent, or Firm* — McClure, Qualey & Rodack, LLP

(57) ABSTRACT

A sense amplifier for reading a via Read-Only Memory (Via-ROM) is provided. The sense amplifier includes a read circuit, an adaptive keeper circuit and a leakage monitor circuit. The read circuit is connected to the via-ROM. The adaptive keeper circuit is connected to the read circuit. The leakage monitor circuit is connected to the adaptive keeper circuit for forming a current mirror, such that the adaptive keeper circuit compensates a read voltage of a memory cell whose via is opened when a bit-line leakage is happened.

13 Claims, 4 Drawing Sheets

(56) References Cited

U.S. PATENT DOCUMENTS

| | | | | |
|---|---|---|---|---|
| 7,474,132 B2 * | 1/2009 | Cheng | | H03K 3/356165 |
| | | | | 327/108 |
| 7,479,807 B1 * | 1/2009 | Cheng | | H03K 19/00384 |
| | | | | 326/121 |
| 7,772,890 B2 * | 8/2010 | Marshall | | H03K 19/0963 |
| | | | | 326/95 |
| 7,928,769 B1 * | 4/2011 | Huang | | H03K 19/0013 |
| | | | | 326/93 |
| 8,295,116 B2 | 10/2012 | Chen et al. | | |
| 8,441,381 B2 * | 5/2013 | Bajdechi | | H03M 1/0607 |
| | | | | 341/135 |
| 8,482,316 B1 * | 7/2013 | Liu | | H03K 19/0963 |
| | | | | 326/121 |
| 9,058,046 B1 * | 6/2015 | Pilo | | G05F 3/267 |
| 9,418,761 B2 * | 8/2016 | Arslan | | G11C 13/004 |
| 9,537,485 B2 * | 1/2017 | Puckett | | H03K 19/00315 |
| 9,625,924 B2 * | 4/2017 | Atallah | | G05F 1/56 |
| 2004/0189337 A1 * | 9/2004 | Hsu | | G01R 31/3012 |
| | | | | 324/762.09 |
| 2004/0189347 A1 * | 9/2004 | Hsu | | H03K 19/0963 |
| | | | | 326/121 |
| 2004/0228183 A1 * | 11/2004 | Ito | | G11C 11/406 |
| | | | | 365/200 |
| 2006/0214695 A1 * | 9/2006 | Lih | | H03K 19/0013 |
| | | | | 326/98 |
| 2007/0252613 A1 * | 11/2007 | Hsu | | G01R 31/2884 |
| | | | | 324/750.3 |
| 2008/0111616 A1 * | 5/2008 | Cheng | | G01R 31/3008 |
| | | | | 327/543 |
| 2008/0129346 A1 * | 6/2008 | Cheng | | H03K 3/356165 |
| | | | | 327/108 |
| 2008/0247251 A1 * | 10/2008 | Genevaux | | G11C 7/08 |
| | | | | 365/210.11 |
| 2009/0015294 A1 * | 1/2009 | Cheng | | H03K 19/00384 |
| | | | | 326/93 |
| 2009/0096485 A1 * | 4/2009 | Marshall | | H03K 19/0963 |
| | | | | 326/83 |
| 2010/0073990 A1 * | 3/2010 | Siau | | G11C 11/5685 |
| | | | | 365/148 |
| 2011/0026354 A1 * | 2/2011 | Lin | | G11C 8/12 |
| | | | | 365/226 |
| 2011/0292753 A1 * | 12/2011 | Hsu | | G11O 5/148 |
| | | | | 365/227 |
| 2016/0172059 A1 | 6/2016 | Arslan et al. | | |

* cited by examiner

SENSE AMPLIFIER

This application claims the benefit of U.S. provisional application Ser. No. 62/412,881, filed Oct. 26, 2016, the disclosure of which is incorporated by reference herein in its entirety.

TECHNICAL FIELD

The disclosure relates in general to a sense amplifier, and more particularly to a sense amplifier for reading a via Read-Only Memory (Via-ROM).

BACKGROUND

Along with the development of semiconductor technology, various memories are invented. Via Read-Only Memory (Via-ROM) records data by vias. Please refer to FIG. 1, which shows an example a Via-ROM 900. The via-ROM 900 includes a plurality of word lines WL9, a plurality of bit lines BL9 and a plurality of memory cells, such as code-0 cells 090 and code-1 cells C91. The source of the code-0 cell C90 is connected to the ground, a via at the drain of the code-0 cell C90 is conducted, and the read voltage of the code-0 cell C90 is ground. The source of the code-1 cell C91 is connected to the ground, a via at the drain of the code-1 cell C91 is opened, and the read voltage of the code-1 cell C91 is high.

The read voltage of one selected code-1 cell C91 may be dropped due to the bit-line leakages happened on the other code-0 cells C90. If a large number of code-0 cells C90 are formed on one bit line, the read voltage of the code-1 cell C91 on this bit line may be greatly dropped and cannot be accurately identified.

Especially, the bit-line leakages are easily happened at high speed via-ROM or high temperature environment and the read voltage of the code-1 cell C91 cannot be accurately identified. Therefore, how to compensate the read voltage under the bit-line leakage is an important issue nowadays.

SUMMARY

The disclosure is directed to a sense amplifier for reading a via Read-Only Memory (Via-ROM). An adaptive keeper is used to adaptively compensates a read voltage of a memory cell whose via is opened when a bit-line leakage is happened.

According to one embodiment, a sense amplifier for reading a via Read-Only Memory (Via-ROM) is provided. The sense amplifier includes a read circuit, an adaptive keeper circuit and a leakage monitor circuit. The read circuit is connected to the via-ROM. The adaptive keeper circuit is connected to the read circuit. The leakage monitor circuit is connected to the adaptive keeper circuit for forming a current mirror, such that the adaptive keeper circuit compensates a read voltage of a memory cell whose via is opened when a bit-line leakage is happened.

According to another embodiment, a sense amplifier for reading a via Read-Only Memory (Via-ROM) is provided. The sense amplifier includes a read circuit, a hybrid keeper circuit and a leakage monitor circuit. The read circuit is connected to the via-ROM. The hybrid keeper circuit is connected to the read circuit. The hybrid keeper circuit includes a static keeper circuit and an adaptive keeper circuit. The static keeper circuit and the adaptive keeper circuit are connected in parallel. The leakage monitor circuit is connected to the adaptive keeper circuit for forming a current mirror, such that the adaptive keeper circuit compensates a read voltage of a memory cell whose via is opened when a bit-line leakage is happened.

According to alternative another embodiment, a sense amplifier for reading a via Read-Only Memory (Via-ROM) is provided. The sense amplifier includes a read circuit, a static keeper circuit and a leakage monitor circuit. The read circuit is connected to the via-ROM. The static keeper circuit is connected to the read circuit. The leakage monitor circuit is connected to the read circuit for forming a current mirror, such that a read voltage of a memory cell whose via is opened is compensated when a bit-line leakage is happened.

Figure 1:
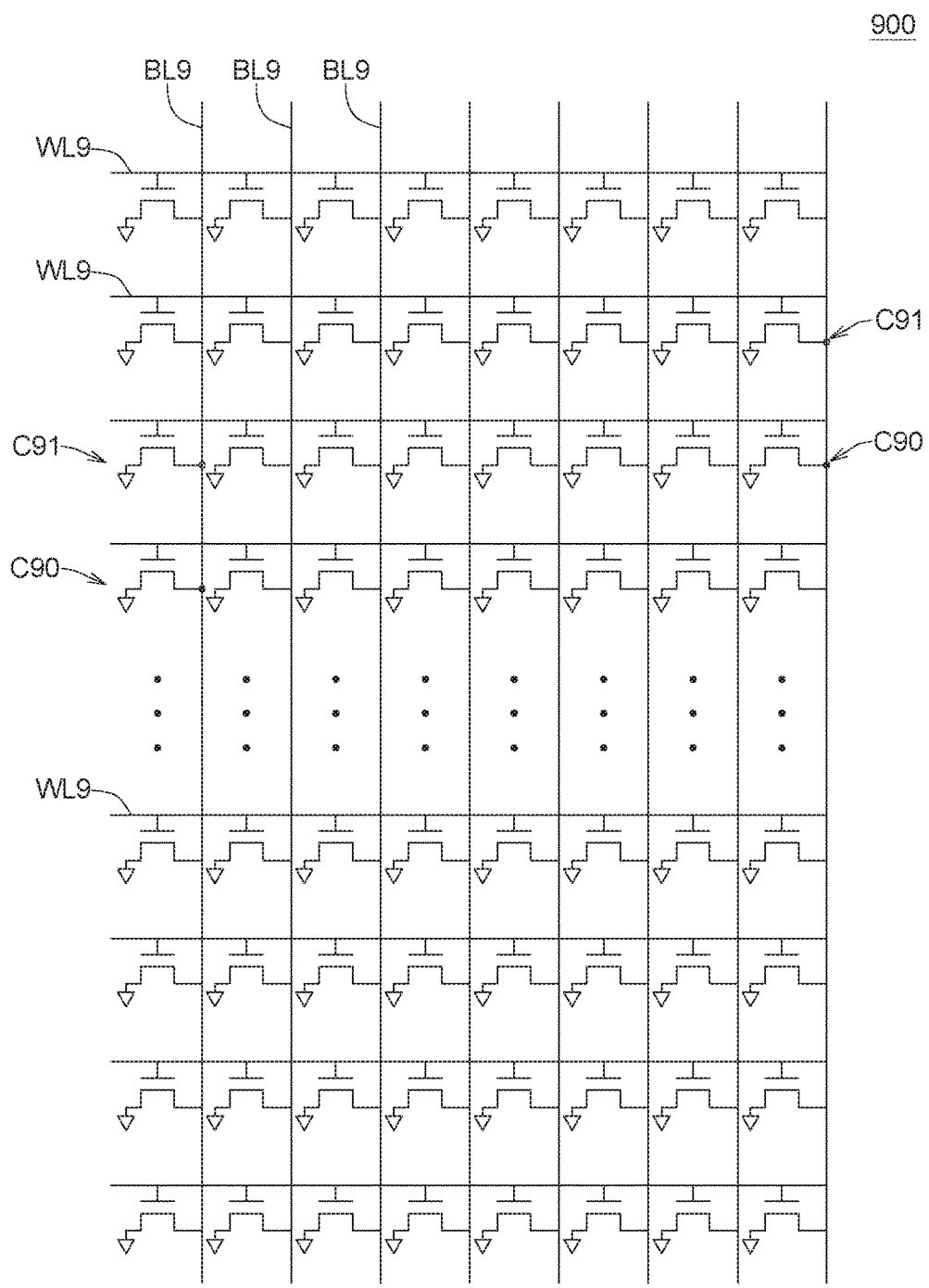
Fig. 1 (prior art) shows an example a Via-ROM.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
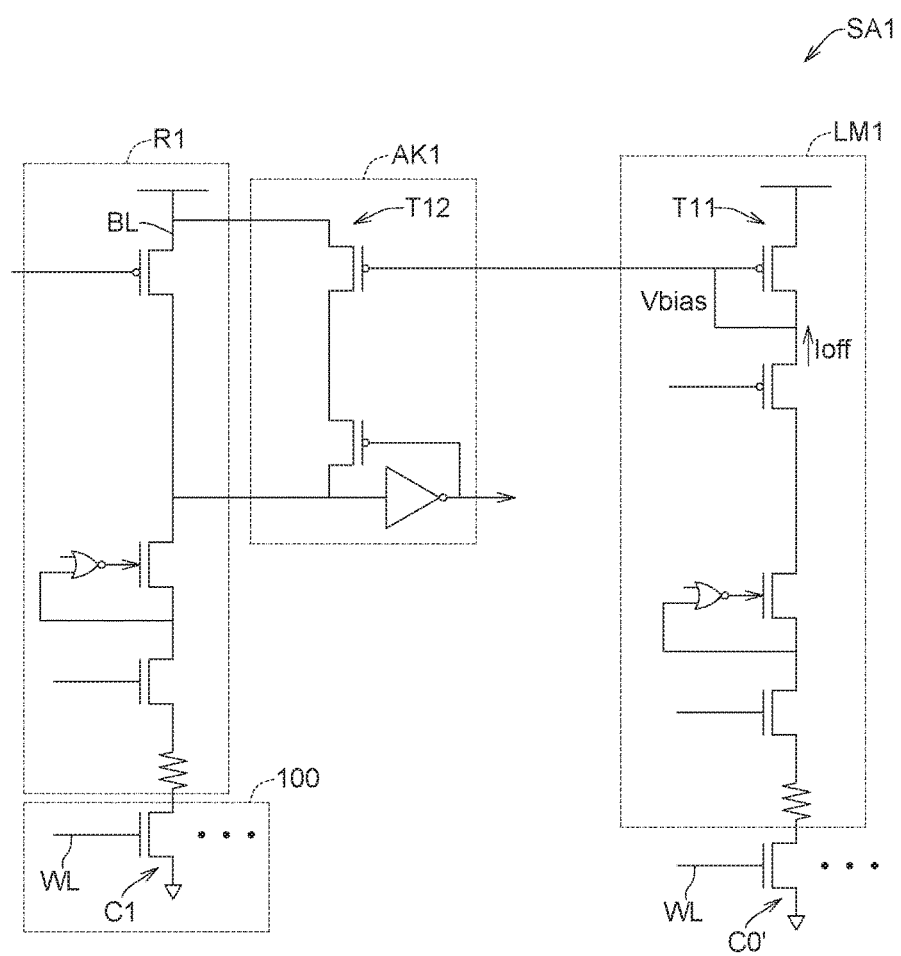
FIG. 2 shows a sense amplifier according one embodiment.

Please refer to FIG. 2, which shows a sense amplifier SA1 according one embodiment. The sense amplifier SA1 is used for reading a via Read-Only Memory (Via-ROM) 100. The sense amplifier SA1 includes a read circuit R1, an adaptive keeper circuit AK1 and a leakage monitor circuit LM1. The read circuit R1 is connected to the Via-ROM 100. The adaptive keeper circuit AK1 is connected to the read circuit R1. The leakage monitor circuit LM1 is connected to the adaptive keeper circuit AK1.

The read circuit R1 is used for reading the read voltage of one memory cell of the Via-ROM 100, such as a code-1 cell C1 whose via is opened, or a code-0 cell (not shown) whose via is conducted. The code-1 cell C1 is connected to a word line WL and a bit line BL. Because the via of the code-1 cell C1 is opened, the read voltage of the code-1 cell C1 should be high. However, when the bit-line leakage is happened, the read voltage of the code-1 cell C1 may be dropped.

The leakage monitor circuit LM1 is used for providing a leakage current Ioff. The leakage monitor circuit LM1 and the adaptive keeper circuit AK1 are connected to form a current mirror, such that the adaptive keeper circuit AK1 compensates the read voltage of the code-1 cell C1 when the bit-line leakage is happened.

The leakage current Ioff of the leakage monitor circuit LM1 and a driving of the adaptive keeper circuit AK1 have a positive relationship. If the temperature is high or the speed of the Via-ROM is high, the bit-line leakage is easily happened. The leakage current Ioff of the leakage monitor circuit LM1 is high and the driving of the adaptive keeper circuit AK1 is high. Therefore, even if the read voltage of the code-1 cell C1 is greatly dropped due to the bit-line leakage, the adaptive keeper circuit AK1 has enough driving ability to compensate the read voltage of the code-1 cell C1.

If the temperature is low or the speed of the Via-ROM 100 is low, the bit-line leakage is not easily happened. The leakage current Ioff of the leakage monitor circuit LM1 is low and the driving of the adaptive keeper circuit AK1 is low. Therefore, when the read voltage of the code-1 cell C1 is not dropped or is slightly dropped due to the bit-line leakage, the adaptive keeper circuit AK1 has low driving ability to slightly compensate the read voltage of the code-1 cell C1.

Further, when a code-0 cell (not shown) is read, the adaptive keeper circuit AK1 has low driving ability or no driving ability, such that the read voltage of the code-0 cell (not shown) can be accurately dropped to be ground. Thus, even if the bit-line leakages are happened at high speed via-ROM or high temperature environment and the read voltages of the code-1 cell C1 and the code-0 cell (not shown) can be accurately identified respectively.

Referring to FIG. 2, a gate of a transistor T11 of the leakage monitor circuit LM1 is connected to a gate of a transistor T12 of the adaptive keeper circuit AK1, and the gate of the transistor T11 is connected to the source/drain of the transistor T11. A bias voltage Vbias of the transistor T11 drives the transistor T12 to be turned on.

In this embodiment, the leakage monitor circuit LM1 and the read circuit R1 are substantially the same. The leakage monitor circuit LM1 is connected to a plurality of dummy cells, such as a plurality of code-0 cells C0'. Each gate of the code-0 cells C0' is connected to a dummy word line WL' which is grounded. Therefore, the leakage current Ioff can be simulated.

In one embodiment, the number of the dummy cells may range from 64 to 512, such as 64, 128, 511 or 512. The number of dummy cells connected to the leakage monitor circuit LM1 is programed.

Figure 3:
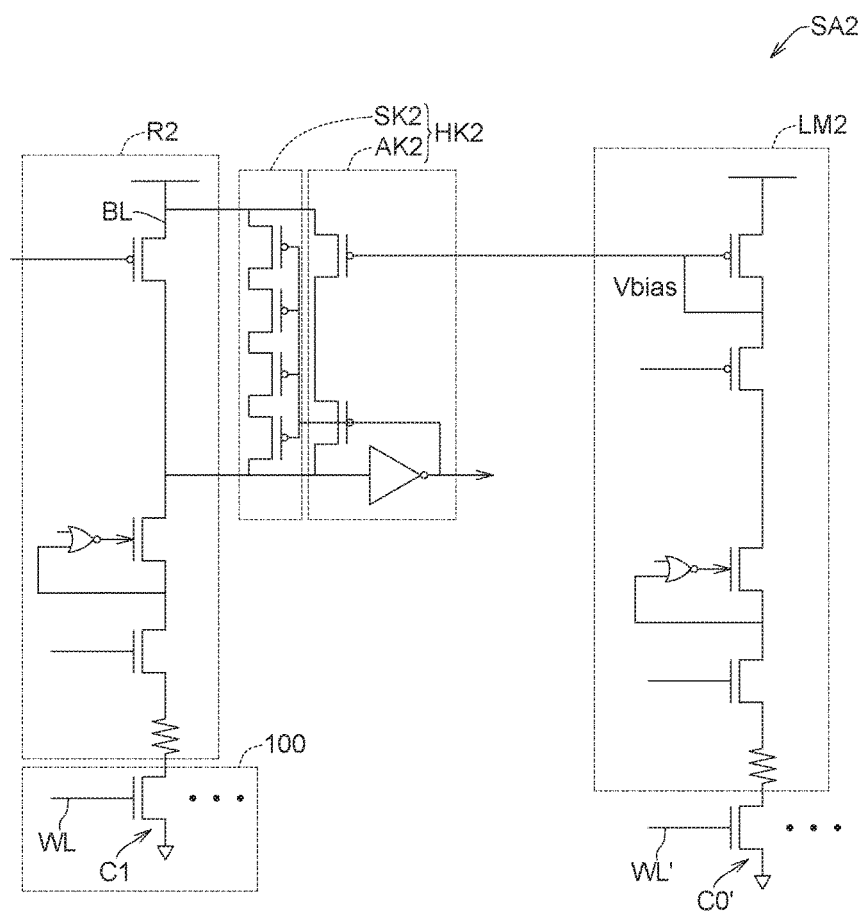
FIG. 3 shows a sense amplifier according another embodiment.

Please refer to FIG. 3, which show a sense amplifier SA2 according to another embodiment. In this embodiment, the sense amplifier SA2 includes a read circuit R2, a hybrid keeper circuit HK2 and a leakage monitor circuit LM2. The read circuit R2 is similar to the read circuit R1, the leakage monitor circuit LM2 is similar to the leakage monitor LM1, and the similarities are not repeated here. The hybrid keeper circuit HK2 is connected to the read circuit R2 and includes a static keeper circuit SK2 and an adaptive keeper circuit AK2. The static keeper circuit SK2 and the adaptive keeper circuit AK2 are connected in parallel.

In this embodiment, the leakage monitor circuit LM2 and the read circuit R2 are substantially the same. The leakage monitor circuit LM2 is connected to several dummy cells, such as the code-0 cells C0'. Each gate of the code-0 cells C0' is connected to the dummy word line WL' which is grounded. Therefore, the leakage current Ioff can be simulated.

The leakage current Ioff of the leakage monitor circuit LM2 and a driving of the adaptive keeper circuit AK2 have a positive relationship. If the temperature is high or the speed of the Via-ROM is high, the bit-line leakage is easily happened. The leakage current Ioff of the leakage monitor circuit LM2 is high and the driving of the adaptive keeper circuit AK2 is high. Therefore, even if the read voltage of the code-1 cell C1 is greatly dropped due to the bit-line leakage, the adaptive keeper circuit AK2 has enough driving ability to compensate the read voltage of the code-1 cell C1.

If the temperature is low or the speed of the Via-ROM 100 is low, the bit-line leakage is not easily happened. The leakage current Ioff of the leakage monitor circuit LM2 is low and the driving of the adaptive keeper circuit AK2 is turned off. Therefore, when the read voltage of the code-1 cell C1 is not dropped, the adaptive keeper circuit AK2 has no driving ability and will not compensate the read voltage of the code-1 cell C1.

Further, when a code-0 cell (not shown) is read, the adaptive keeper circuit AK2 has no driving ability, such that the read voltage of the code-0 cell (not shown) can be accurately dropped to be ground.

In this embodiment, the driving of the static keeper circuit SK2 is less than the driving of the adaptive keeper circuit AK2. The static keeper circuit SK2 is used for assisting the adaptive keeper circuit AK2 at the low temperature.

For example, if the temperature is low, the leakage current Ioff of the leakage monitor circuit LM2 is low and the driving of the adaptive keeper circuit AK2 is low. Even if the driving of the adaptive keeper circuit AK2 is lowered, the static keeper circuit SK2 still can compensate the read voltage of the code-1 cell C1. Thus, even if the bit-line leakages are happened at high speed via-ROM or high temperature environment and the read voltages of the code-1 cell C1 and the code-0 cell (not shown) can be accurately identified respectively.

In one embodiment, the number of the dummy cells may range from 64 to 512, such as 64, 128, 511 or 512. The number of dummy cells connected to the leakage monitor circuit LM2 is programed.

Figure 4:
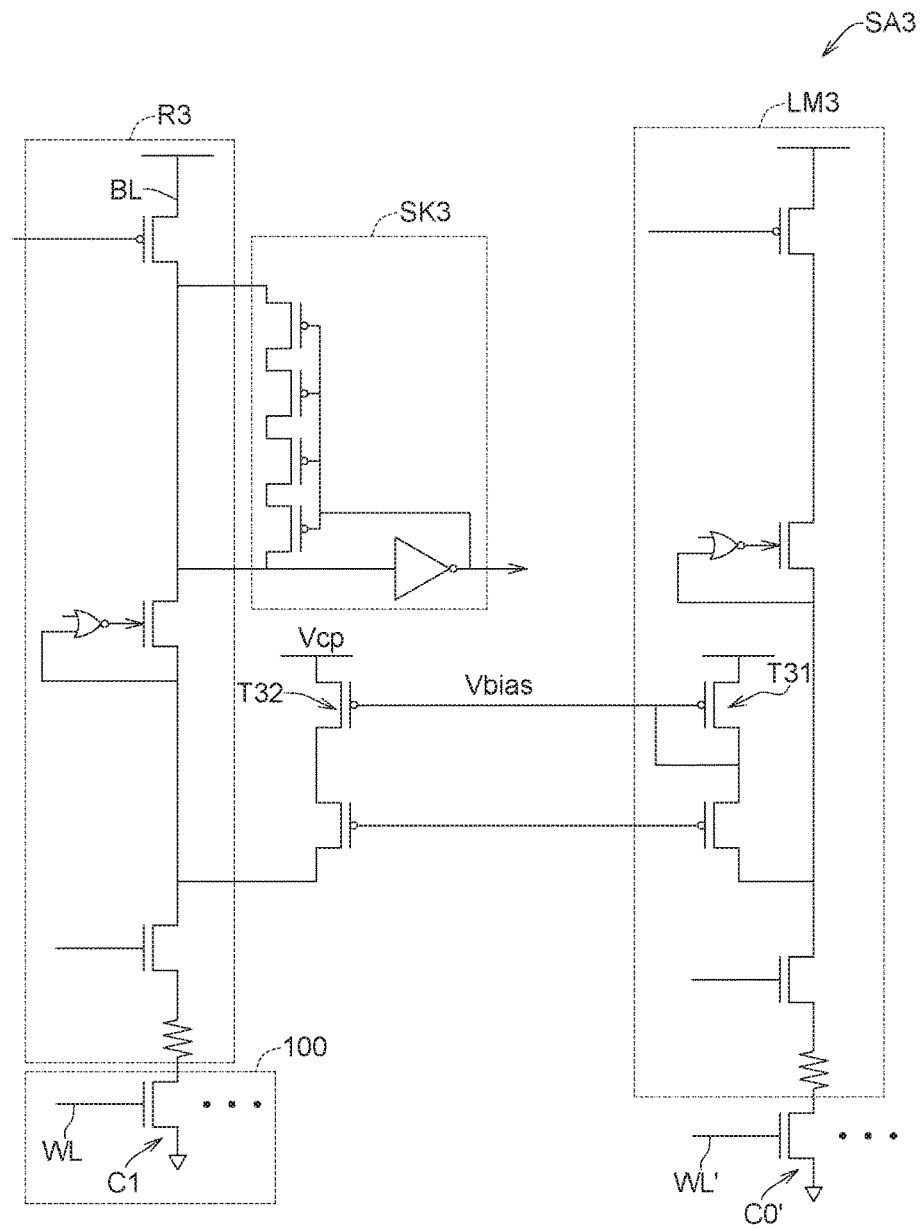
FIG. 4 shows a sense amplifier according another embodiment.

Please referring to FIG. 4, which shows a sense amplifier SA3 according to another embodiment. The sense amplifier SA3 includes a read circuit R3, a static keeper circuit SK3 and a leakage monitor circuit LM3. The static keeper circuit SK3 is connected to the read circuit R3 to compensate the read voltage of the code-1 cell C1 when the bit-line leakage is happened.

Further, in this embodiment, the leakage monitor circuit LM3 is connected to the read circuit R3 for forming a current mirror. A gate of a transistor T31 of the leakage monitor circuit LM3 is connected to a gate of a transistor T32 of the read circuit R3. When the bit-line leakage is happened, a bias voltage Vbias of the transistor T31 drives the transistor T32 to be turned on, such that a compensation voltage Vcp can compensate the read voltage of the code-1 cell C1. Thus, even if the bit-line leakages are happened at high speed via-ROM or high temperature environment and the read voltages of the code-1 cell C1 and the code-0 cell (not shown) can be accurately identified respectively.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A sense amplifier, for reading a memory, comprising:
a read circuit connected to the memory;
an adaptive keeper circuit connected to the read circuit; and
a leakage monitor circuit connected to the adaptive keeper circuit for forming a current mirror, such that the adaptive keeper circuit compensates a read voltage of a memory cell when a bit-line leakage is happened;
wherein a gate of a transistor of the leakage monitor circuit is coupled to a gate of a transistor of the adaptive keeper circuit, the current mirror is formed by a part of the leakage monitor circuit and a part of the adaptive keeper circuit, and another part of the leakage monitor circuit and the read circuit are substantially the same.

2. The sense amplifier according to claim 1, wherein a leakage current of the leakage monitor circuit and a driving of the adaptive keeper circuit have a positive relationship.

3. The sense amplifier according to claim 1, wherein a number of dummy cells connected to the leakage monitor circuit is programed.

4. A sense amplifier, for reading a memory, comprising:
a read circuit connected to the memory;
a hybrid keeper circuit connected to the read circuit, wherein the hybrid keeper circuit includes:
a static keeper circuit; and
an adaptive keeper circuit, wherein the static keeper circuit and the adaptive keeper circuit are connected in parallel; and
a leakage monitor circuit connected to the adaptive keeper circuit for forming a current mirror, such that the adaptive keeper circuit compensates a read voltage of a memory cell when a bit-line leakage is happened;
wherein a gate of a transistor of the leakage monitor circuit is coupled to a gate of a transistor of the adaptive keeper circuit.

5. The sense amplifier according to claim 4, wherein a driving of the static keeper circuit is less than a driving of the adaptive keeper circuit.

6. The sense amplifier according to claim 4, wherein a leakage current of the leakage monitor circuit and a driving of the adaptive keeper circuit have a positive relationship.

7. The sense amplifier according to claim 4, wherein the leakage monitor circuit and the read circuit are substantially the same.

8. The sense amplifier according to claim 4, wherein a number of dummy cells connected to the leakage monitor circuit is programed.

9. A sense amplifier, for reading a memory, comprising:
a read circuit connected to the memory;
a static keeper circuit connected to the read circuit; and
a leakage monitor circuit connected to the read circuit for forming a current mirror, such that a read voltage of a memory cell is compensated when a bit-line leakage is happened;
wherein a gate of a transistor of the leakage monitor circuit is coupled to a gate of a transistor of the read circuit, the current mirror is formed by a part of the leakage monitor circuit and a part of the read circuit, and another part of the leakage monitor circuit and another part of the read circuit are substantially the same.

10. The sense amplifier according to claim 9, wherein a number of dummy cells connected to the leakage monitor circuit is programed.

11. The sense amplifier according to claim 1, wherein the memory is a via Read-Only Memory (Via-ROM) and a via of the memory cell which is compensated is opened.

12. The sense amplifier according to claim 4, wherein the memory is a via Read-Only Memory (Via-ROM) and a via of the memory cell which is compensated is opened.

13. The sense amplifier according to claim 9, wherein the memory is a via Read-Only Memory (Via-ROM) and a via of the memory cell which is compensated is opened.

* * * * *